United States Patent [19]
Hashimoto

[11] Patent Number: 5,910,926
[45] Date of Patent: Jun. 8, 1999

[54] APPARATUS AND METHOD FOR A DYNAMIC RANDOM ACCESS ARCHITECTURE

[75] Inventor: Masashi Hashimoto, Tsukuba Ibaraki, Japan

[73] Assignee: Texas Instruments Incorporated, Dallas, Tex.

[21] Appl. No.: 08/923,695

[22] Filed: Sep. 4, 1997

Related U.S. Application Data

[60] Provisional application No. 60/025,619, Sep. 6, 1996.
[51] Int. Cl.$^6$ ........................................ G11C 8/00
[52] U.S. Cl. ........................ 365/230.03; 365/189.04; 365/185.21; 365/196; 365/233
[58] Field of Search ................ 365/210, 189.07, 365/189.29, 189.33, 230.03, 233, 230.08, 185.21, 196, 191, 102, 189.04, 202

[56] References Cited

U.S. PATENT DOCUMENTS

| | | | |
|---|---|---|---|
| 5,307,321 | 4/1994 | Sasai et al. | 365/230.03 |
| 5,384,745 | 1/1995 | Konishi et al. | 365/230.03 |
| 5,412,613 | 5/1995 | Galbi et al. | 365/230.03 |
| 5,610,871 | 3/1997 | Hidaka | 365/230.03 |
| 5,703,829 | 12/1997 | Suzuki et al. | 365/233 |

*Primary Examiner*—David Nelms
*Assistant Examiner*—Thong Le
*Attorney, Agent, or Firm*—Robby T. Holland; Carlton H. Hoel; Richard L. Donaldson

[57] ABSTRACT

A memory unit 30 is provided with a first and second sense amplifier array 32A and 32B. The storage cells 31 of the memory unit are coupled to both sense amplifier arrays. A control unit 34 is provided which controls the operation of the two sense amplifier arrays. The control unit determines through which sense amplifier array data signals are transferred to and from the storage cells. The sense amplifier array not exchanging signals with the I/O terminals can perform the precharge operations and write-back operations. Synchronous operation of the memory unit and a data processing unit can be maintained by alternating the sense amplifier array performing the current memory access operation.

22 Claims, 15 Drawing Sheets

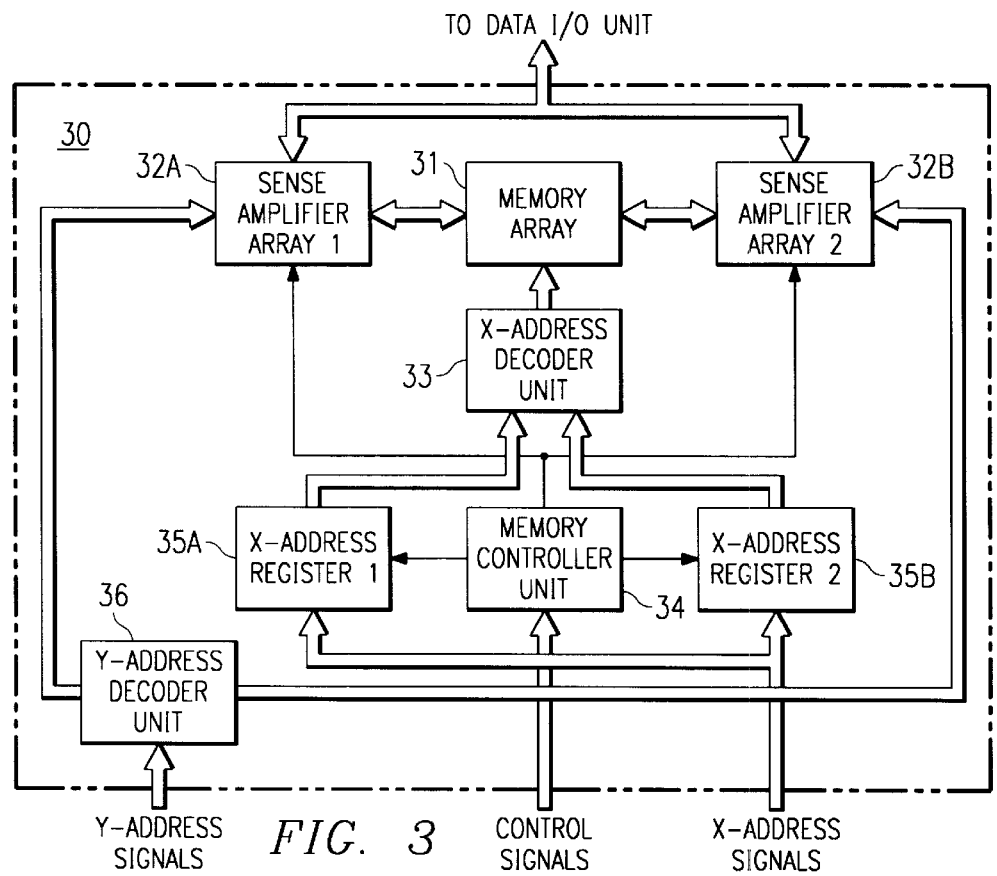
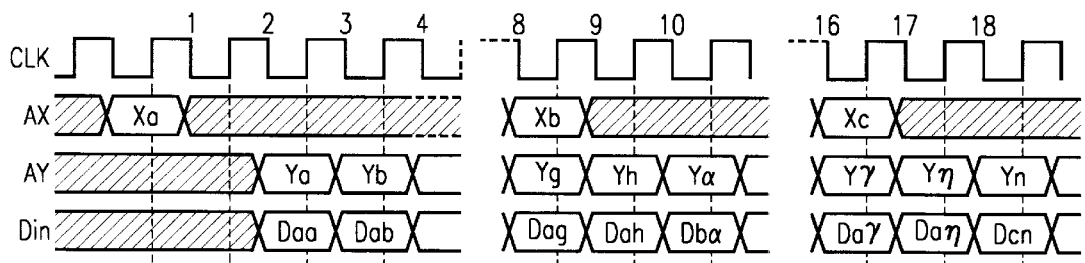
FIG. 4A
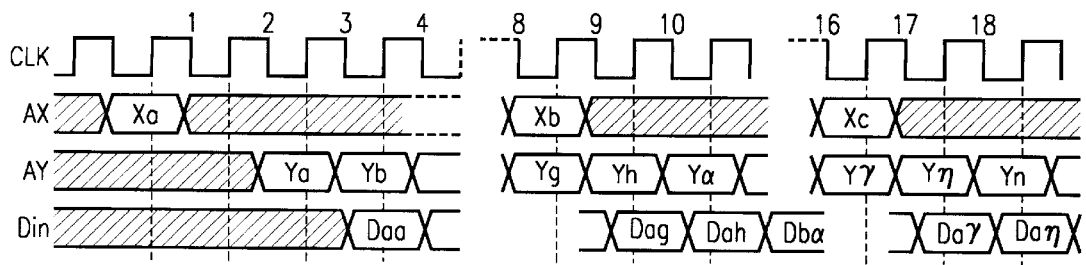
FIG. 4B

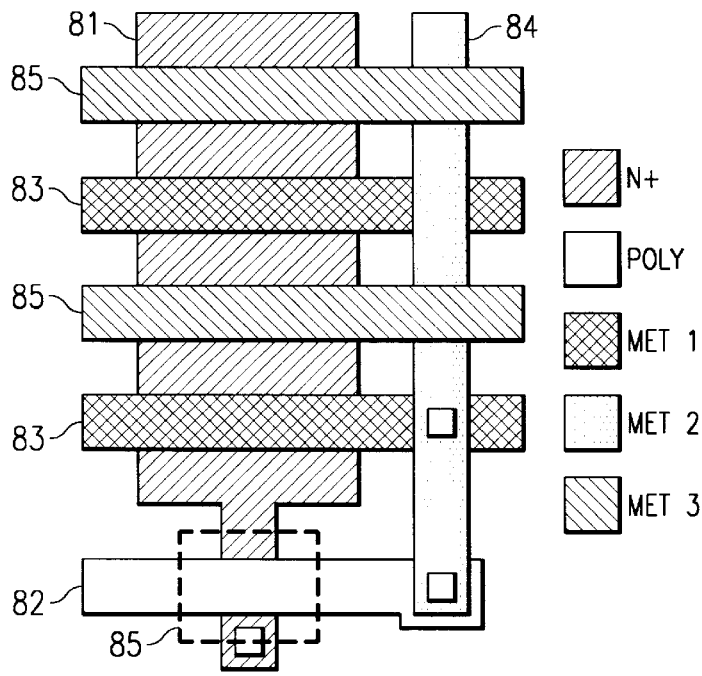
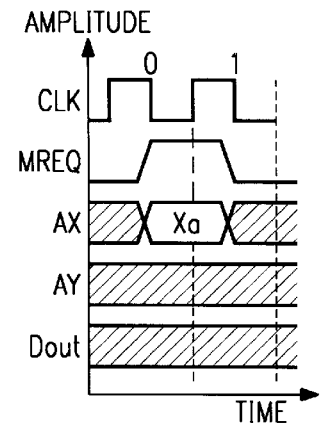
FIG. 8B
FIG. 9B
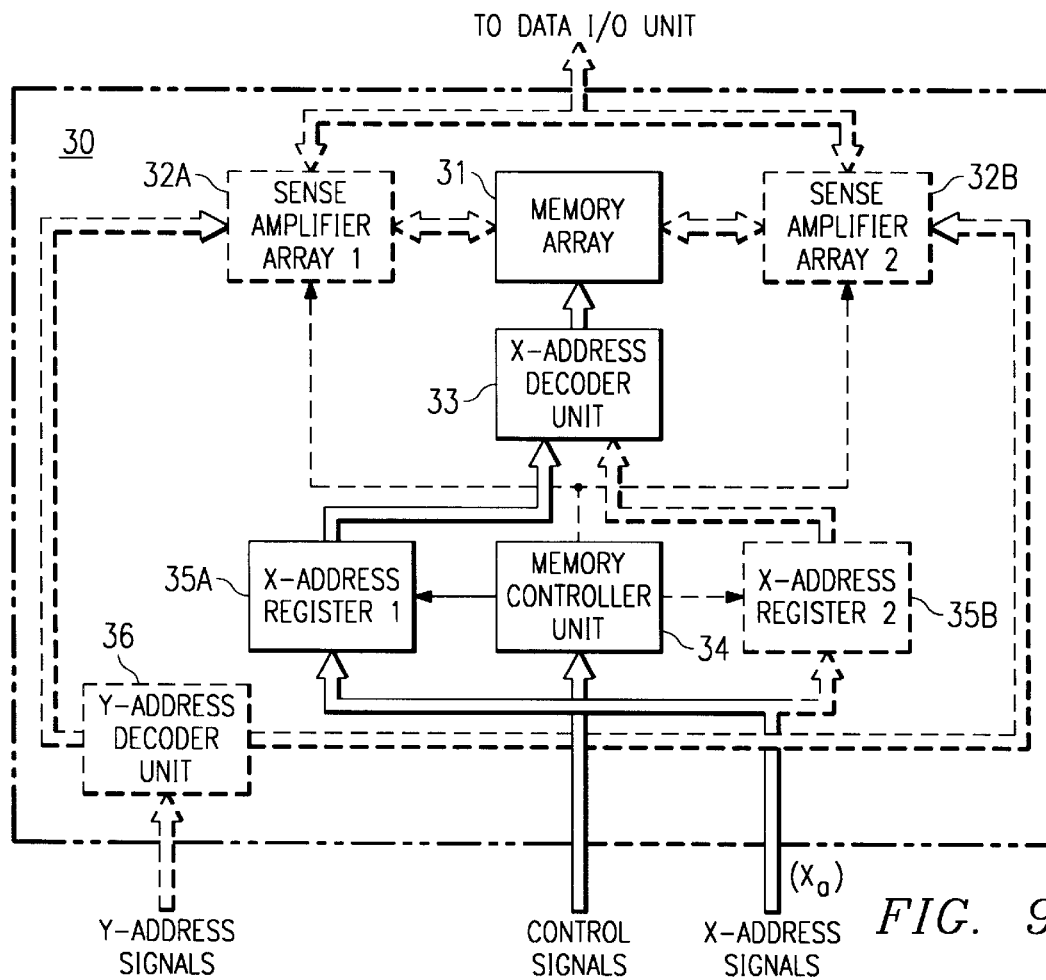
FIG. 9A

APPARATUS AND METHOD FOR A DYNAMIC RANDOM ACCESS ARCHITECTURE

This is a Non Provisional application filed under 35 U.S.C. 119(e) and claims priority of prior provisional Ser. No. 60/025,619 of inventor Hashimoto filed Sep. 6, 1996.

FIELD OF THE INVENTION

This invention relates generally to integrated circuit, semiconductor memory units and, more particularly, to an architecture for synchronous dynamic random access memory (SDRAM) units which eliminates the conflict between a memory bank precharge cycle and a central processing unit access of that memory bank.

DESCRIPTION OF THE RELATED ART

In a synchronous dynamic ransom access memory (SDRAM) unit, the components of the memory unit must be precharged prior to access by the central processing unit. Because the precharge operation takes a few clock cycles, this operation can be in conflict with the access of the memory unit by the central processing unit thereby limiting the effective bandwidth of data processing system. In order to reduce the overlap of the precharge operation and the access by the central processing unit in the prior art, the memory storage cell array has been divided into two or more memory banks. In this configuration, one memory bank can be implementing the precharge operation while the central processing unit access the second memory bank. However, this configuration does not eliminate the overlap problem. Referring to FIG. 1, a portion 10 of a memory unit necessary for exposition of the present invention is shown. Control signals are applied to memory controller unit 14, x-address signals are applied to the x-address register 15, y-address signals are applied to the y-address register 17, and data signals are exchanged between the data I/O unit (not shown) and sense amplifier array 12A and sense amplifier array 12B. Control signals from memory controller unit 14 are applied to sense amplifier array 12A, to sense amplifier array 12B, and to x-address register 15. The contents of x-address register 15 are applied to x-address decoder 13A and to x-address decoder 13B. The sense amplifier array 12A exchanges signals with memory bank 11A; while sense amplifier array 12B exchanges signals with memory bank 11B. X-address decoder 13A applies address signals to memory bank 11A; while x-address decoder 13 applies address signals to memory bank 11B. The y-address decoder unit 16 receives y-address signals from the y-address register 17 applies the decoded y-address signals to the sense amplifier array 12A and to sense amplifier array 12B.

Referring next to FIG. 2A and FIG. 2B, the relationship as a function of time for selected signals for memory unit 10 is illustrated for the non-conflict situation (FIG. 2A) and the conflict situation (FIG. 2B) between the precharge operation and the central processing unit access in a memory unit having the memory storage cell array divided into two memory arrays. These Figures illustrate a read operation with a latency of 3 clock cycles and a burst length of 8 clock cycles. In both Figures, the x-address Ax is applied to the memory bank 12A during the first clock cycle and the y-address Ay is applied to the memory bank 12A during the third clock cycle. The data from the memory bank 12A is read out in the fourth through the eleventh clock cycles for both Figures. In the case that the x-address Xb is located in memory bank 12B, no conflict exists in the precharge operation and the storage cell access. The x-address is then applied to memory bank 12B during the ninth clock cycle, the y-address applied during the eleventh clock cycle and the data is read out from the memory bank 12B during the twelfth through the nineteenth clock cycle. In FIG. 2B, when the x-address Xb is located in memory bank 12A, a conflict between the precharge operation and access operation is present. The x-address can not be applied to memory bank 12A until the thirteenth clock cycle, the y-address is applied during the fifteenth clock cycle, and the data is read out during the sixteenth through the twenty third clock cycle.

As will be clear, the conflict between the precharge operation and the memory access operation compromises the synchronous operation between the memory unit and the central processing unit. One technique for reducing the conflict between the precharge operation and the memory access operation is to increase the number of memory banks. However, this technique will not completely eliminate the problem and will add complexity to the memory unit 10.

A need has therefore been felt for apparatus and an associated method for eliminating the conflict between the precharge operation and the central processing unit access operation of the memory unit. The apparatus and associated method must permit the synchronous operation of the central processing unit and the memory to be maintained without a multiplicity of independently addressable memory arrays.

SUMMARY OF THE INVENTION

The aforementioned and other features of the present invention are accomplished, according to the present invention, by providing a single memory array with two sets of sense amplifiers and an associated memory unit controller. Each memory unit storage cell is coupled to both sets of sense amplifiers. In response to control signals, a first set of sense amplifiers accesses memory locations. After the requisite data signals are transferred from the memory array to the first set of sense amplifiers and are being transferred to the I/O terminals, the second set of sense amplifiers will, if the previous memory access cycle was a READ operation, a WRITE operation, or mixed READ and WRITE operations, write-back the data signals from the second set of sense amplifiers to the storage cells of the memory unit. After storage of the signals involved in the previous READ, WRITE, or mixed READ and WRITE operation is complete, a precharge of the memory array is implemented. Thereafter, the next memory access is performed by means of the second set of sense amplifiers. In this manner synchronous operation can be maintained between the central processing unit and the memory unit.

These and other features of the present invention will be understood upon the reading of the following description in conjunction with the Figures.

BRIEF DESCRIPTION OF THE DRAWINGS

FIG. 2A is a timing diagram showing the relationship of selected signals in a non-conflict situation between a pre-charge operation and a memory access operation for FIG. 1; while

FIG. 3 is a block diagram of a portion of a synchronous dynamic random access memory according to the present invention.

FIG. 4A is a timing diagram showing the relationship of selected signals for a write operation in a dynamic random access memory operation according to the present invention; while FIG. 4B is a timing diagram showing the relationship of selected signals for a read operation in a dynamic random access memory operation according to the present invention.

FIG. 8A is a third embodiment of dynamic random access memory unit having a block of memory storage cells activated by two banks of sense amplifier units, while FIG. 8B is a diagram illustrating an implementation of a storage cell for the embodiment of the memory unit of FIG. 8A.

FIG. 9A is a block diagram of the present invention showing the components which are active during the first cycle of a READ operation; while FIG. 9B is a timing diagram showing the time dependence of selected signals during the first cycle of a READ operation.

FIG. 10A is a block diagram of the present invention showing the components which are active during the second cycle of a READ operation; while

FIG. 11A is a block diagram of the present invention illustrating the components which are active during the third cycle of a READ operation; while

FIG. 12A is a block diagram of the present invention illustrating the components which are active during the fourth cycle of a READ operation; while

FIG. 13A is a block diagram of the present invention illustrating the components which are active during the fifth cycle of a READ operation; while

FIG. 14A is a block diagram of the present invention illustrating the components which are active during the ninth cycle of a READ operation; while

FIG. 15A is a block diagram of the present invention illustrating the components which are active during the tenth cycle of a READ operation; while

FIG. 16A is a block diagram of the present invention illustrating the components which are active during the eleventh cycle of a READ operation; while

FIG. 17A is a block diagram of the present invention illustrating the components which are active during the twelfth cycle of a READ operation; while

DESCRIPTION OF THE PREFERRED EMBODIMENT(S)

1. Detailed Description of the Drawings

Figure 1:
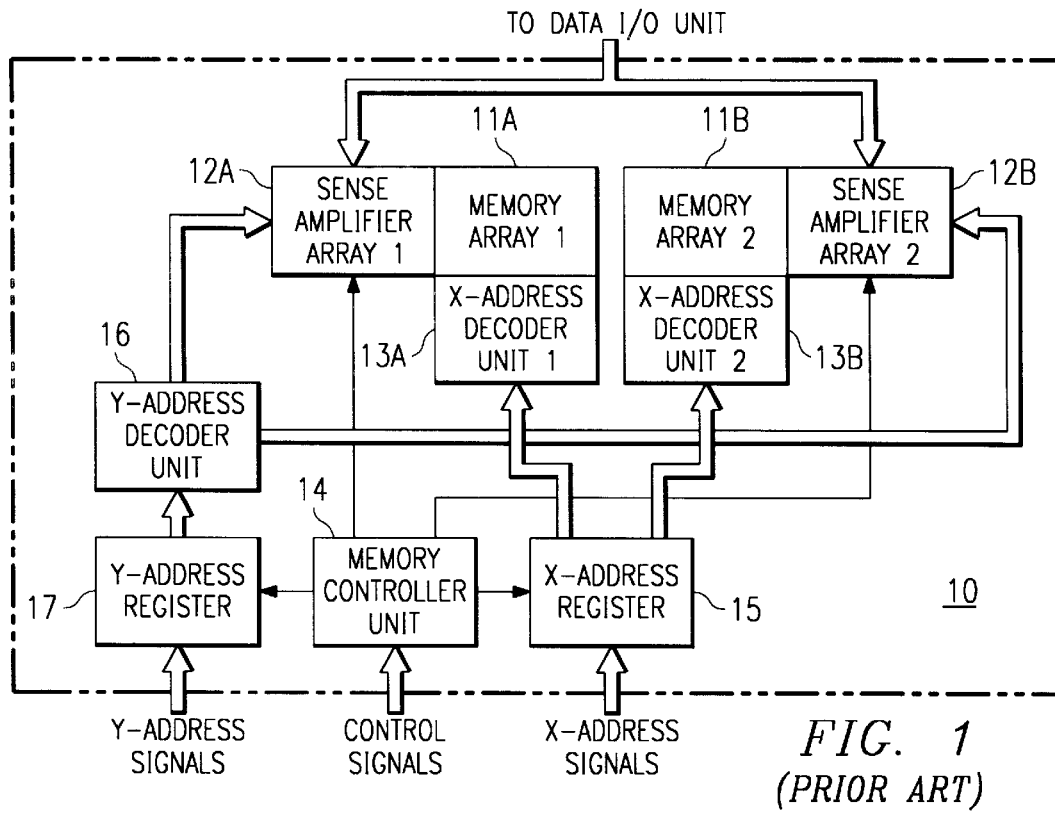
FIG. 1 is a block diagram of a portion of a synchronous dynamic random access memory unit according to the prior art.
Figure 2A:
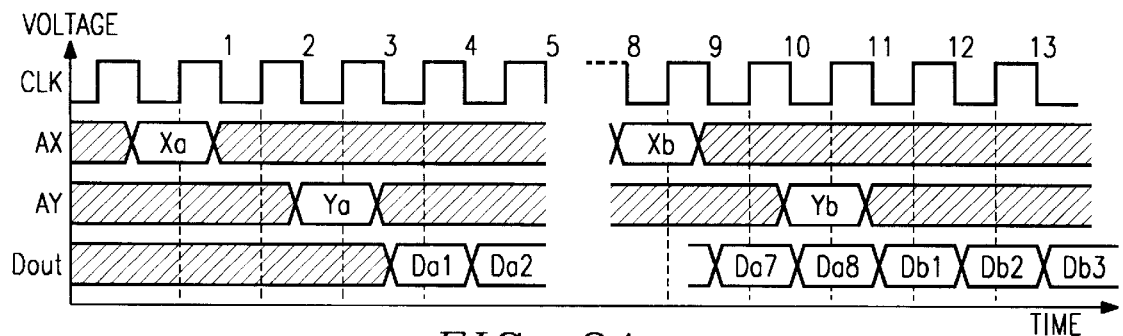
Figure 2B:
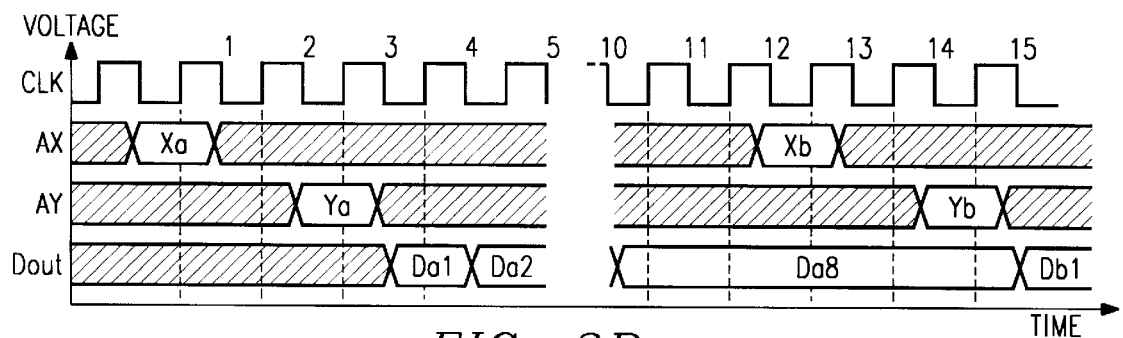
FIG. 2B is a timing diagram showing the relationship between selected signals in an conflict situation between a precharge operation and a memory access operation for FIG. 1.

FIG. 1, FIG. 2A and FIG. 2B have been described with respect to the prior art.

Referring to FIG. 3, a schematic diagram of the memory portion 30 according to the present invention is shown. X-address signals are applied to x-address register 35A and to x-address register 35B. The x-address register 35A and x-address register 35B apply signals to the x-decoder unit 33. The x-address decoder unit 33 controls the location access to memory array 31. The memory array 31 has sense amplifier array 32A and sense amplifier array 32B coupled thereto. Sense amplifier array 32A and sense amplifier array 32B, and x-address register 35A and x-address register 35B receive control signals from the memory control unit 34. The y-address decoder unit 36 has y-address signals applied thereto and applies signals to sense amplifier 32A and to sense amplifier 32B. (A y-address register, not shown, can be positioned between the y-address decoder unit 36 and the applied y-address signals or can be included as part of the y-address decoder unit 36.)

Referring to FIG. 4A and FIG. 4B, timing diagrams of selected signals for a WRITE operation (FIG. 4A) and for a READ operation (FIG. 4B) of the apparatus of FIG. 3 are shown. In each diagram, the clock signals CLK, the x-address signals Ax, the y-address signals Ay and the data signal (data in Din or data out Dout) are illustrated. Note that the memory unit operation is synchronous.

Figure 5:
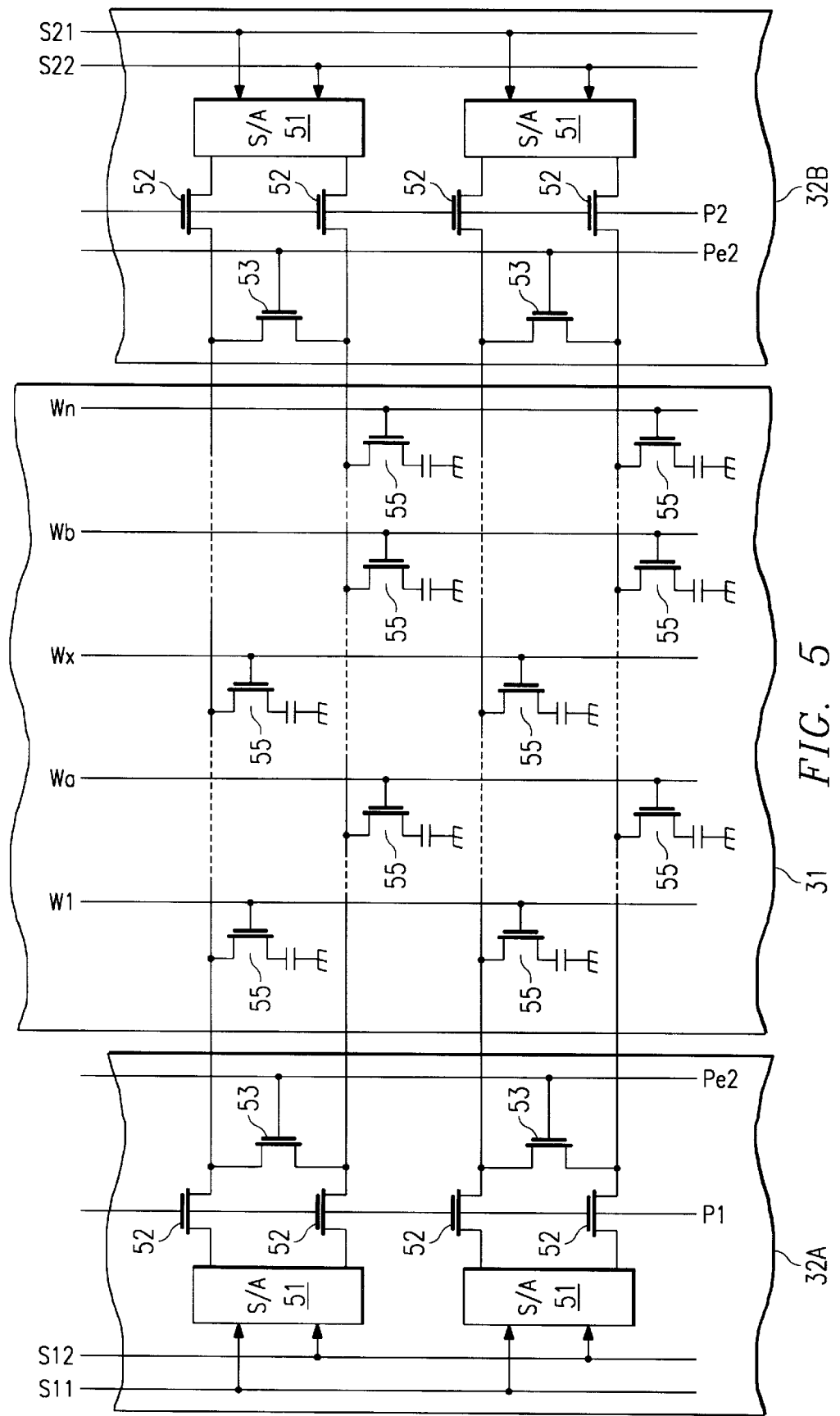
FIG. 5 is a first embodiment of a dynamic random access memory unit have a block of memory storage cells activated by two banks of sense amplifier units.

Referring to FIG. 5, a first embodiment of the block diagram shown in FIG. 3 is illustrated. The sense amplifier arrays 32A and 32B each include a plurality of sense amplifiers (S/A) 51. The sense amplifier array 32A has control signals S11 and S12 coupled to the component sense amplifiers 51. The bitline conductor pairs from the sense amplifiers 51 have transistor gates 52 positioned between the sense amplifiers and the storage cells 55 of the memory array 31. The transistor gates 52 have control grids coupled to the P1 signal. Coupled between the bitline conductor pair of each sense amplifier, equalization transistors 53 have the gate terminals coupled to the Peq (equalization) signal. The gate terminals of the transistor components of the storage cells 55 of memory 31 are coupled to wordline conductor W1 through Wn. The memory controller unit 34 generates the Smn signals, the Pq signals and the Peq signal.

Figure 6:
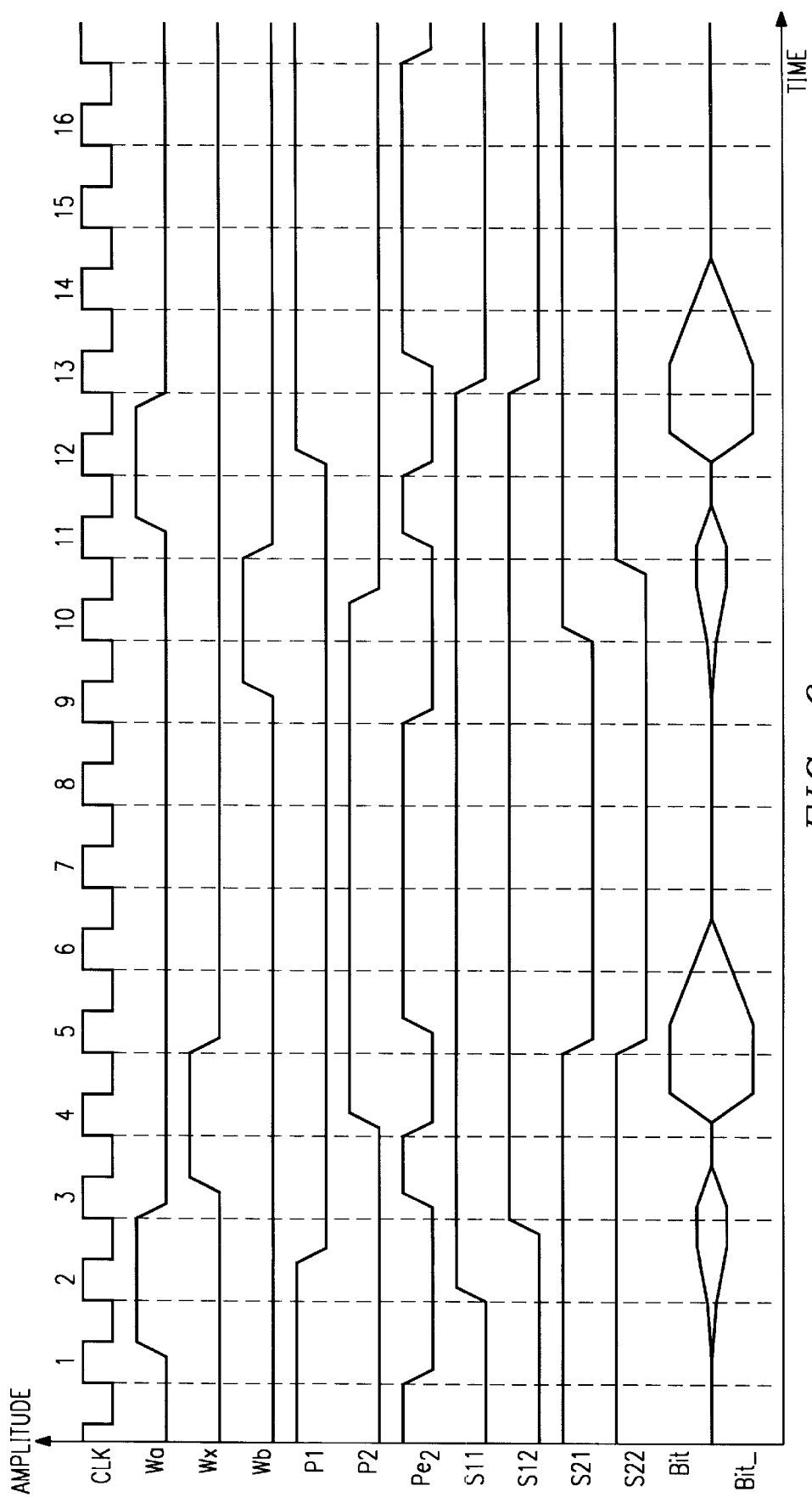
FIG. 6 is a timing diagram showing time dependence of selected signals for the embodiment of the present invention shown in FIG. 5.

Referring to FIG. 6, selected signals illustrate the operation of memory unit of FIG. 3. The signals presented include the clock signal (CLK); wordline signals Wa, Wx, and Wb; precharge signals P1, P2, and P3; control signals S11, S12, S21, and S22; and the bitline conductor signals Bit and Bit_. The equalization signal is the signal concluding the precharge operation.

Figure 7:
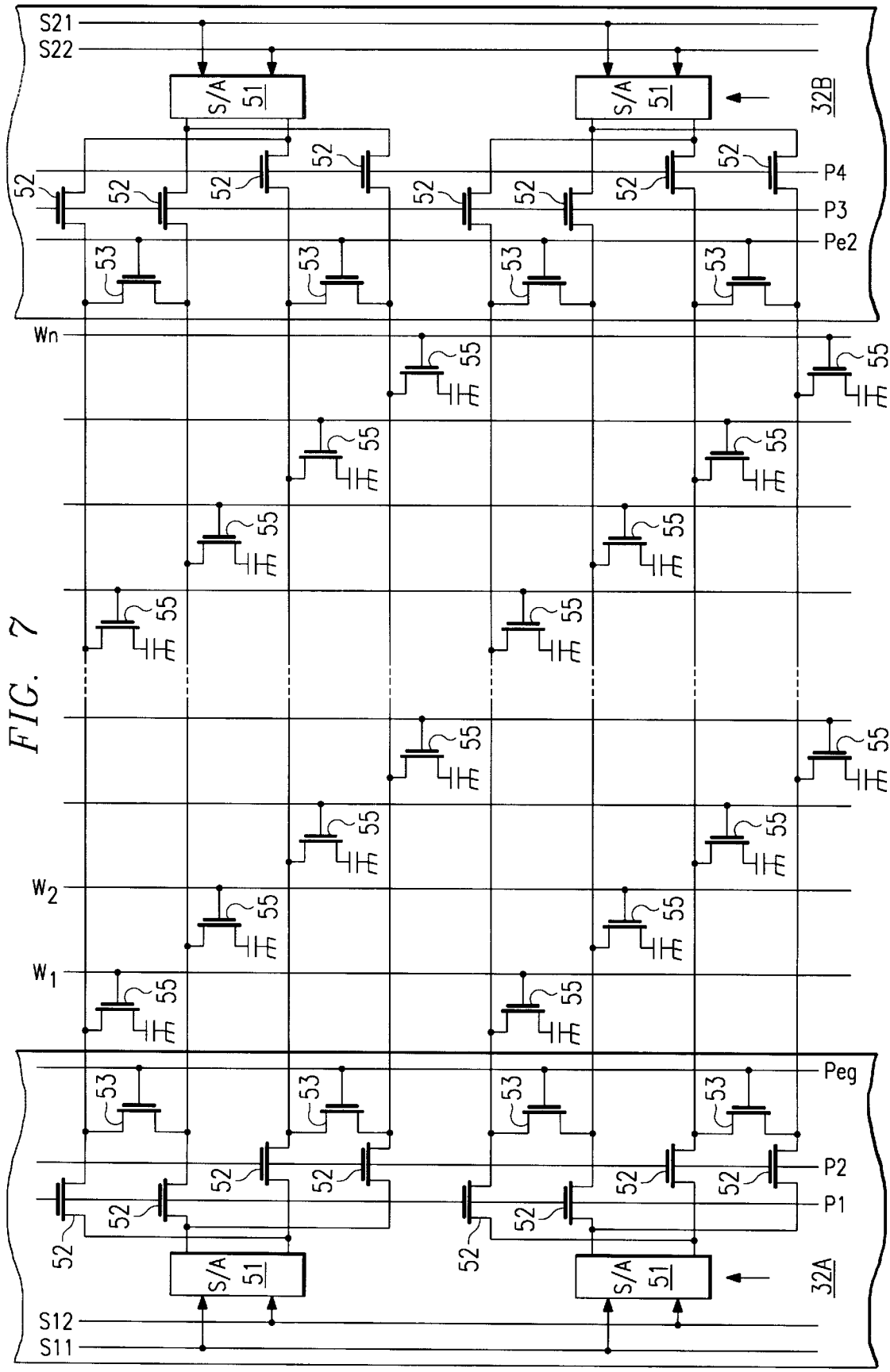
FIG. 7 is a second embodiment of a dynamic random access memory unit having a block of memory storage cells activated by two banks of sense amplifier units.

Referring to FIG. 7, a second embodiment the present invention is shown. Each sense amplifier 51 has two bitline conductor pairs associated therewith. In this manner, the number storage cells which can be accessed can be doubled. In addition, the number of precharge control signals must be doubled, i.e., the P1 and P2 control signals now becomes the P1, P2, P3, and P4 control signals.

Figure 8A:
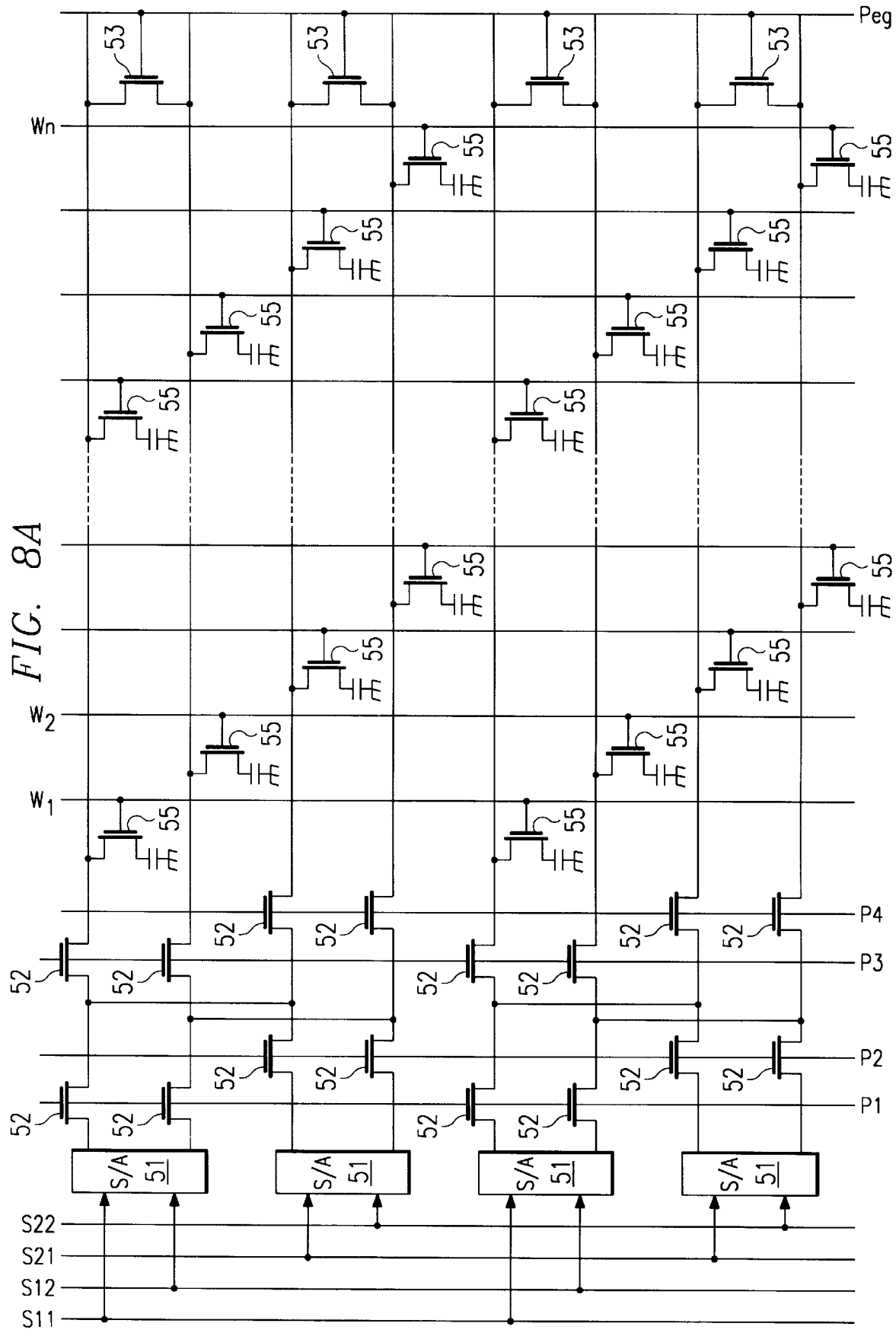

Referring to FIG. 8A, a third embodiment of the memory unit of the present invention is shown. This implementation permits, as in FIG. 7, each sense amplifier 51 can access two sets of storage cells 55. Once again, four control signals P1, P2, P3, and P4 are required to select which of two amplifiers 51 has access to the bitline conductor pair. In this embodiment however, the number of equalization transistors 53 has been reduced by a factor of two.

Referring to FIG. 8B, an embodiment of storage cell 55 is illustrated. The capacitor 81 is a N+ doped substrate region. The wordlines 83 are formed from a metal 1 layer, while the wordlines 85 are formed from a metal 3 layer. The coupling transistor is located in area 85 with the conductor layer 82, formed from a polysilicon layer, acting as the gate of transistor 85. Conductor 84, formed from a metal 3 layer, couples one of the wordlines 83 and 85 to the conductor 82. The bitline (not shown) is located above the elements shown in FIG. 8B.

2. Operation of the Preferred Embodiment(s)

Referring once again to FIG. 3, the memory array of the present invention has two sense amplifier arrays (i.e., 32A and 32B). Each sense amplifier array can access any location in the memory array. The two sense amplifier arrays are used in an interleaving manner. In this manner, while one sense amplifier is transferring data to the I/O terminals, the second sense amplifier can be executing a precharge operation.

The operation of the present invention is illustrated in more detail in FIG. 9A through FIG. 17B in which the active components of the memory unit are associated with specific cycles in a READ operation. The READ operation has a READ latency of 3 and burst length of 8. Referring to FIG. 9A and FIG. 9B as well as FIG. 6, during first cycle, the memory unit is activated by the MREQ (MEMORY REQUEST) signal. The bitline equalization signal Peq assumes a low value. The x-address Xa is applied to x-address register 35A. The contents of the x-address register 35A are applied to x-address decoder unit 33. After a time delay, the x-address decoder 33 activates one of the word lines Wa in the memory array. Each of the storage cells connected to the wordline Wa is activated. The capacitor of the storage cell is coupled to the bitline conductor pair. As a result of charge transfer, a small voltage difference is developed between the bitline and the bitline_ conductors. This voltage difference is then amplified within the sense amplifier and the selectively (based on the y-address signals) applied to the I/O terminals.

Figure 10A:
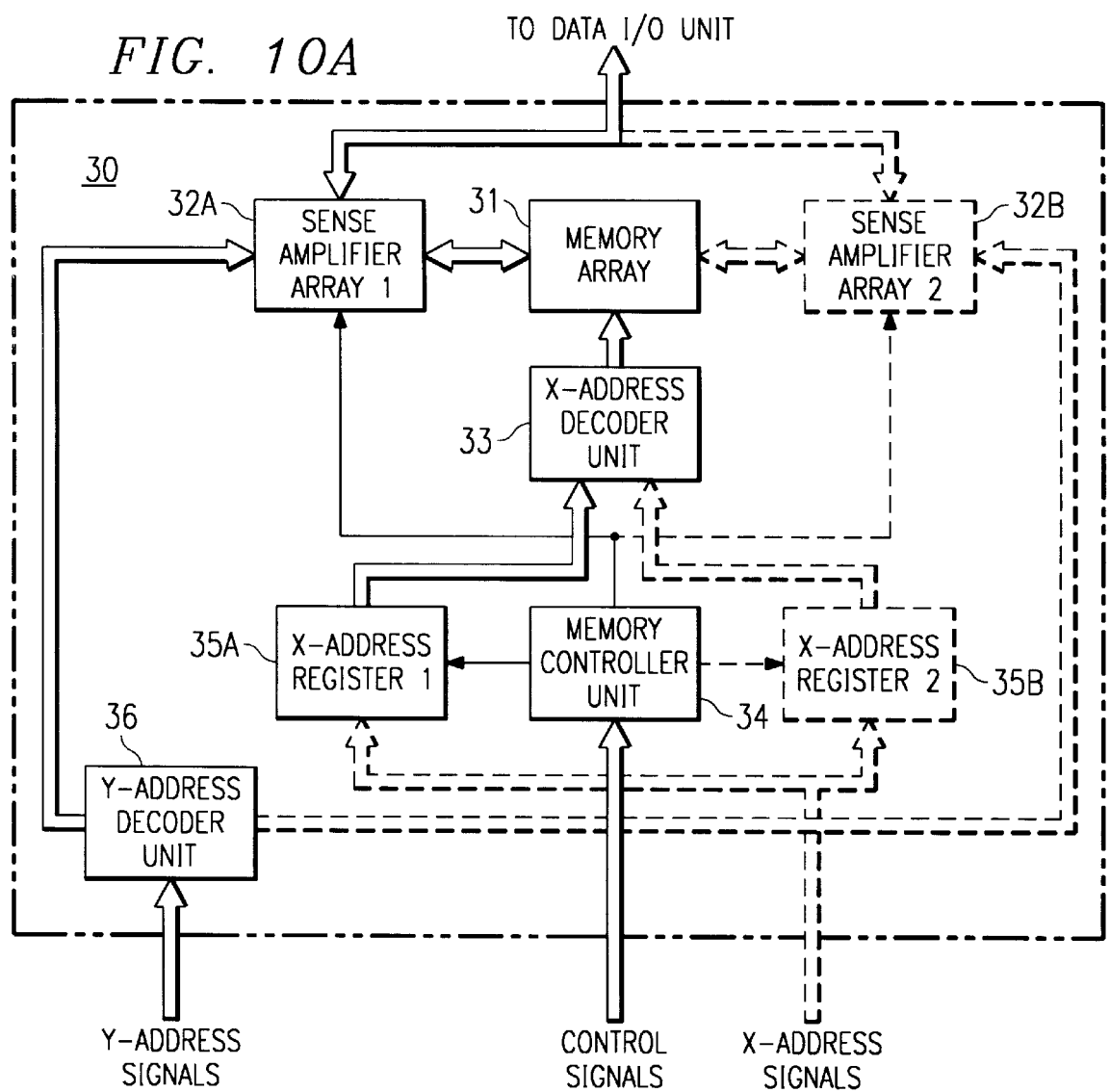
Figure 10B:
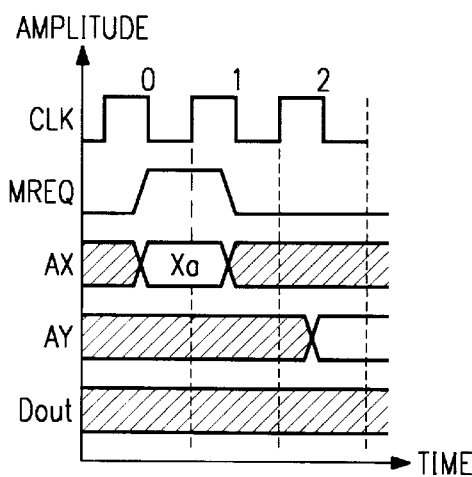
FIG. 10B is a timing diagram showing the time dependence of selected signals during the second cycle of a READ operation.

Referring to FIG. 10A and FIG. 10B (and FIG. 6), in the second cycle, the sense amplifier activation signal S11 is driven to a high value. The small voltage difference between the bitline and the bitline_ conductors are amplified. In the implementation herein described, a conventional two-step sensing scheme is assumed. Therefore, the S11 drives the sense with a manner in which the differential voltage is amplifier relatively slowly (cf. FIG. 6). After a time delay, the bitline isolation signal P1 drops. Then the sense amplifier activation signal S12 has a high value. The data signals in the sense amplifier are amplified to the full VDD or VGND levels. As a result of the exchange of charge between the storage cell capacitor and the bitline conductor, the charge on the storage cell capacitor may no longer represent a data signal.

Figure 11A:
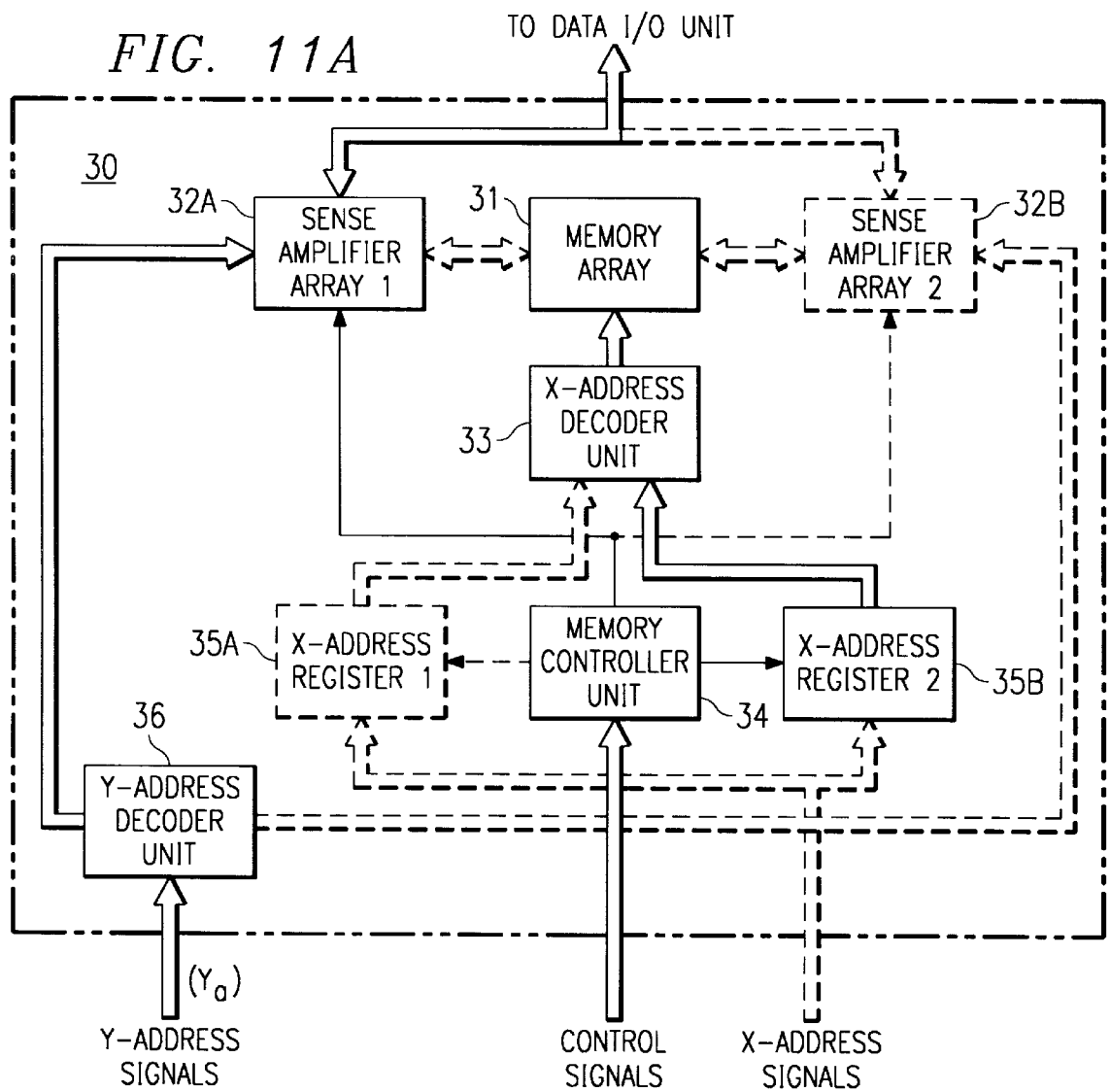
Figure 11B:
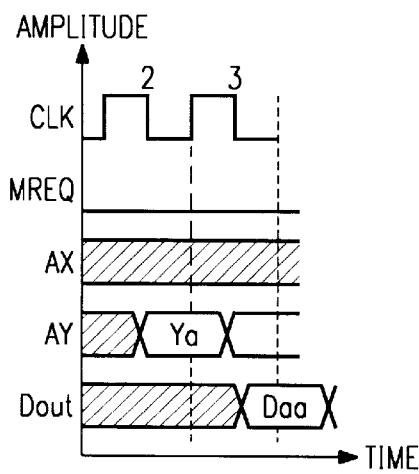
FIG. 11B is a timing diagram showing the time dependence of selected signals during the third cycle of a READ operation.

Referring to the FIG. 11A, 11B, and FIG. 6, in the third cycle, the y-address Ya is applied to the memory unit 30. The y-address decoder unit 36 has the y-address applied thereto and decodes the y-address. The addressed data signals Daa is applied to the output terminals of the sense amplifier array 32A. At the same time, all of the bitline and bitline-conductor pairs are equalized by the Peq signal. (Note that this bitline and bitline_ conductor pair equalization may be skipped.) In parallel with this activity, the previous x-address (in this case a meaningless x-address Wx) latched in x-address register 35B is sent to the x-address decoder 33 after the wordline Wa has been decoded.

Figure 12A:
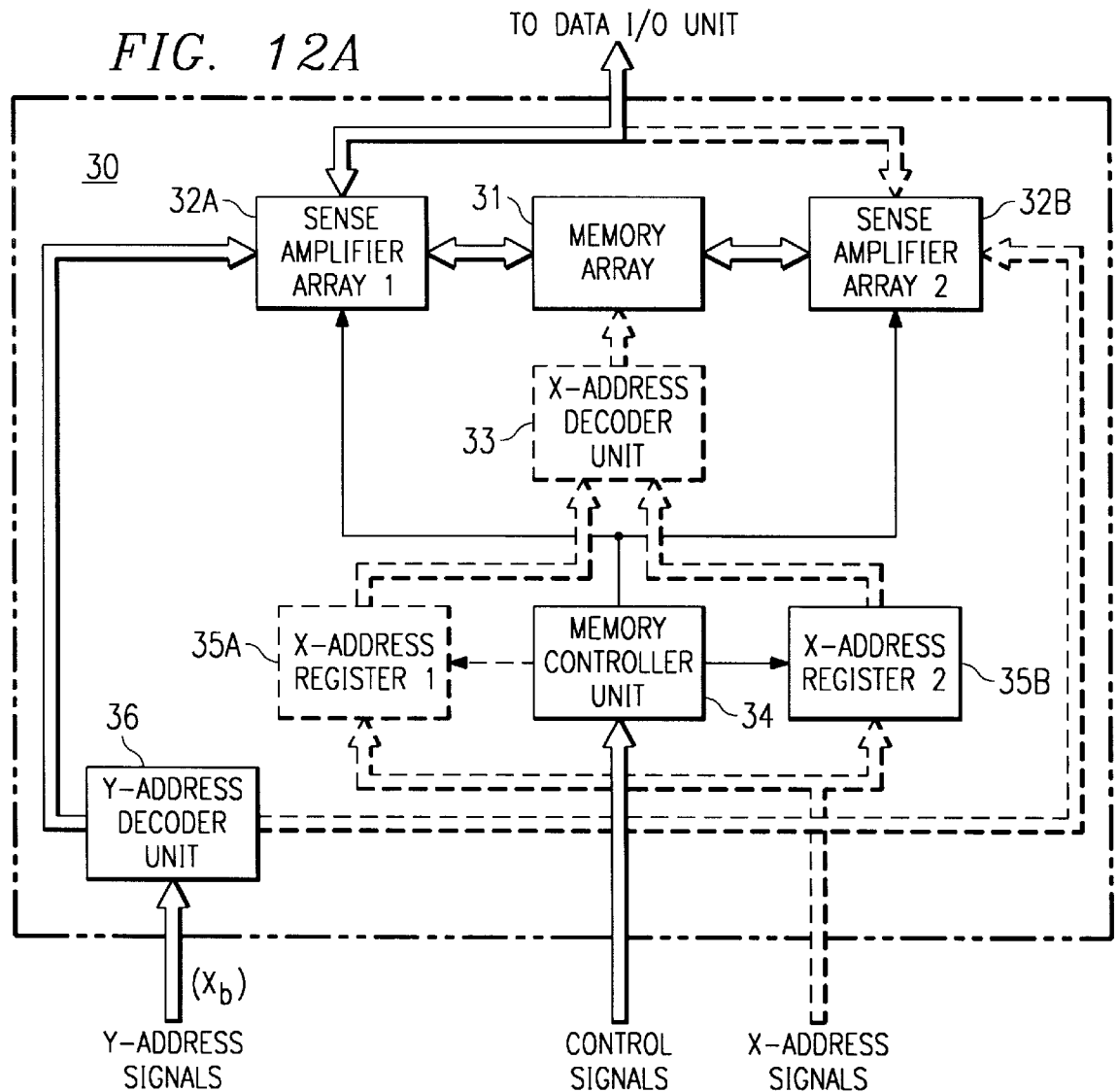
Figure 12B:
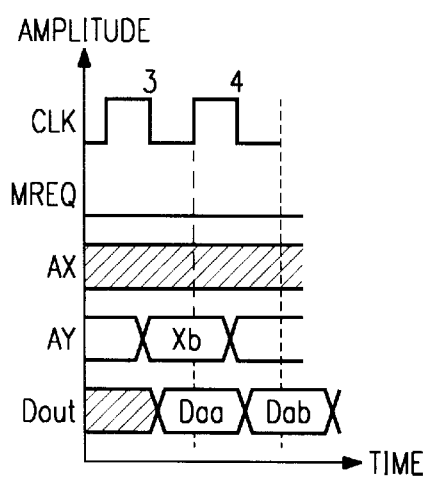
FIG. 12B is a timing diagram showing the time dependence of selected signals during the fourth cycle of a READ operation.

Referring to FIG. 12A, FIG. 12B, and FIG. 6, in the fourth cycle, the y-address Yb is applied to the memory unit. The y-decoder unit 36 has Yb applied thereto and decodes the address. The sense amplifier array 32A applies the addressed data Dab to the output terminals. The Peq signal has a low value and P2 has a high value. The sense amplifier array 35B is coupled to the memory array by the signal P2. By that procedure, the data signals in sense amplifier array 32B are transferred (written-back) to the memory cells which are connected to the wordline Wx, thereby restoring the data signals compromised by a READ operation, a WRITE operation, or mixed READ and WRITE operations.

Figure 13A:
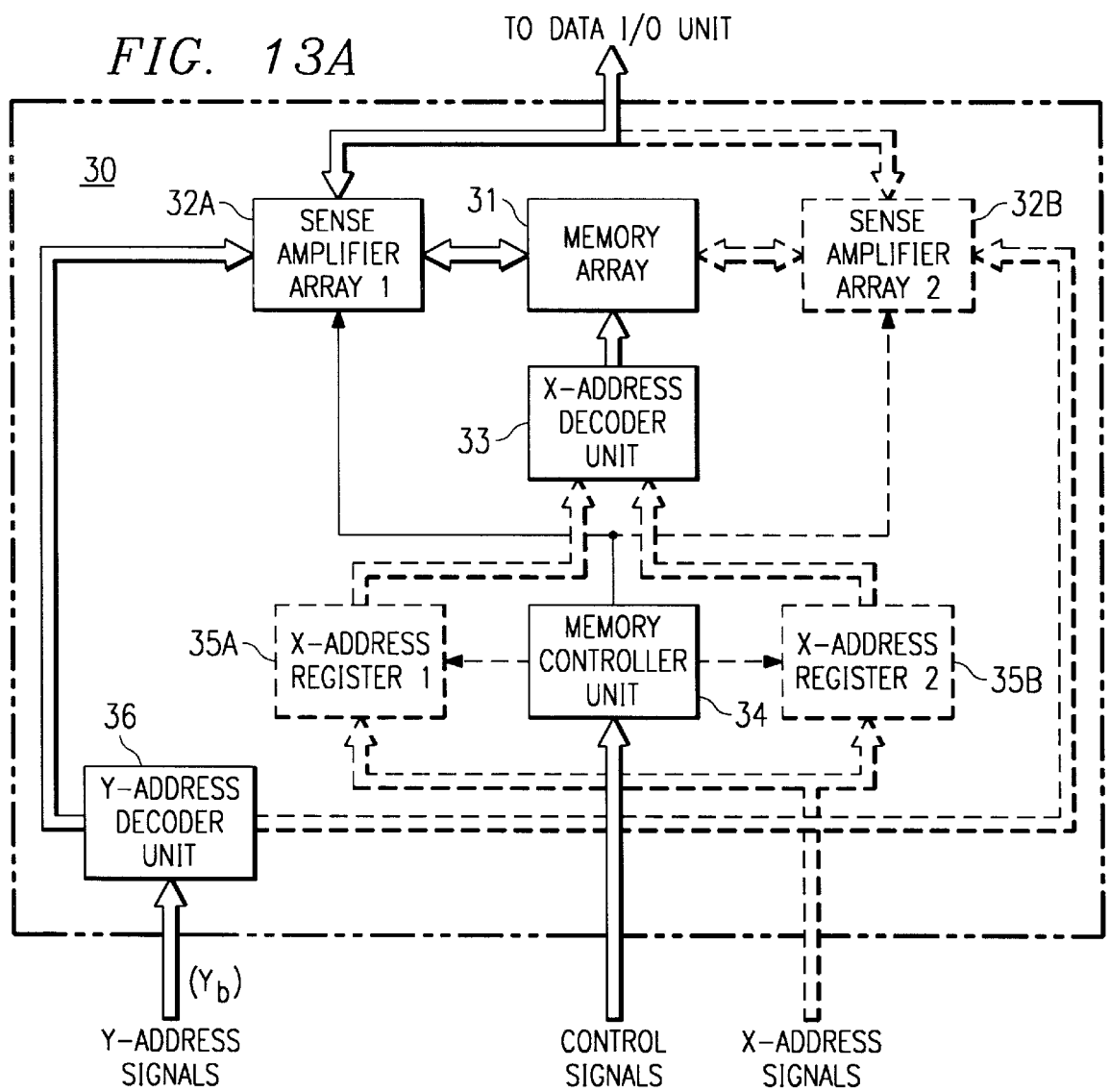
Figure 13B:
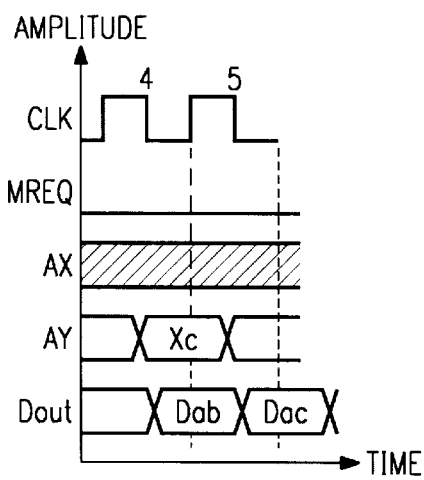
FIG. 13B is a timing diagram showing the time dependence of selected signals during the first fifth of a READ operation.

Referring to FIG. 13A, FIG. 13B, and FIG. 6, in the fifth cycle, in addition to the application of the Dac data signals to the output terminal, the memory array 31 begins the precharge operation after Wx is deactivated and sense amplifier array 32B is deactivated by a low value of signals S21 and S22.

In the sixth to the eighth cycle, the addressed data from the memory array is being applied to the output terminals of sense amplifier array 32A. During this same period, the memory array 31 continues with the precharge operation.

Figure 14A:
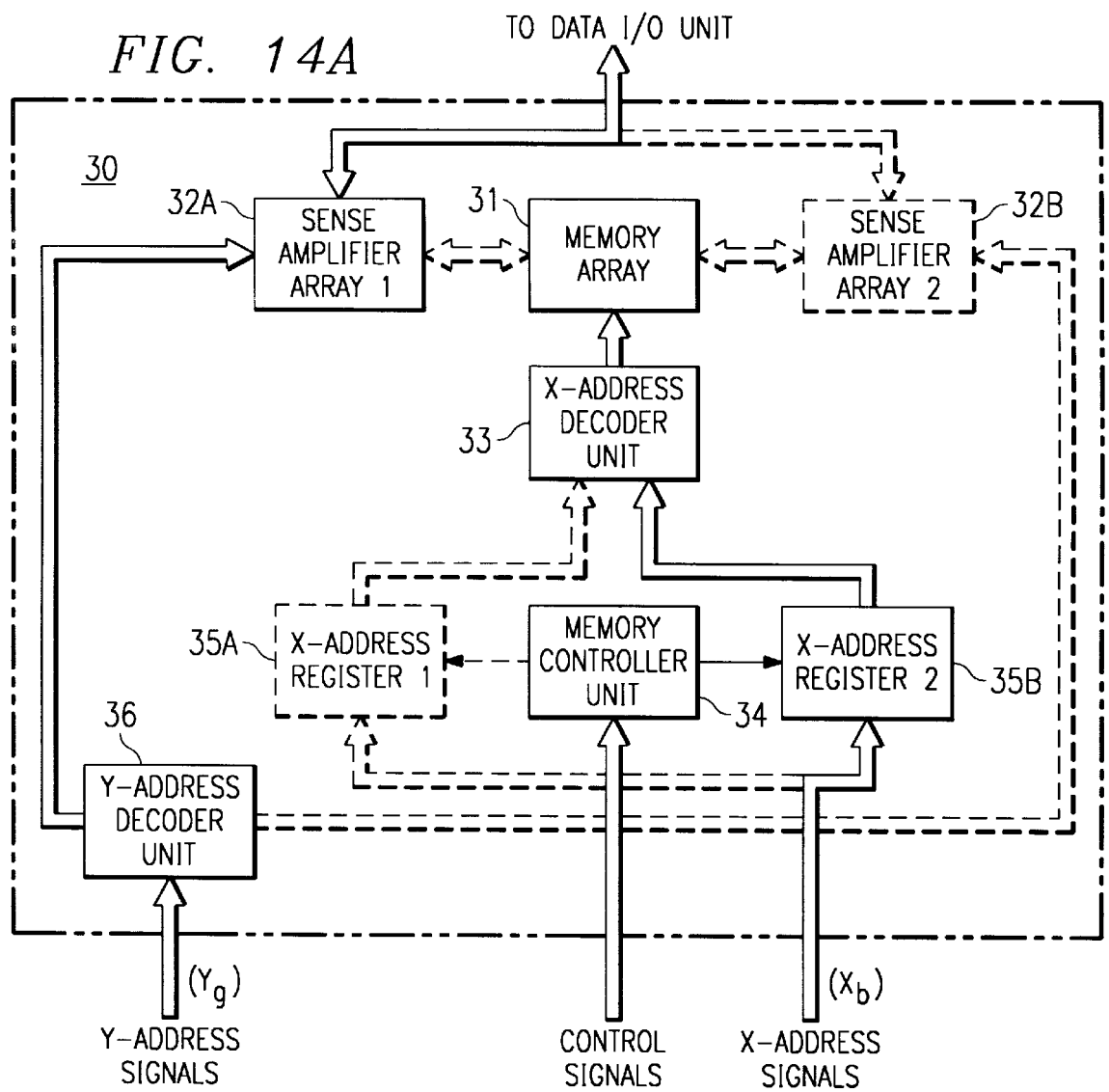
Figure 14B:
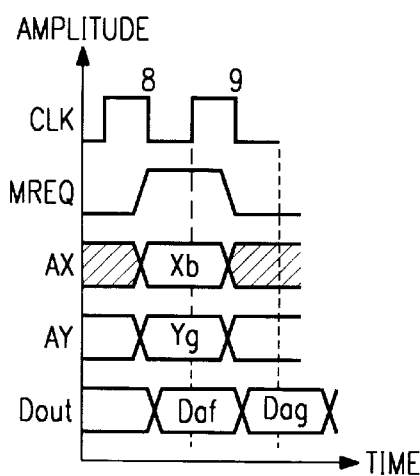
FIG. 14B is a timing diagram showing the time dependence of selected signals during the ninth cycle of a READ operation.
Figure 15A:
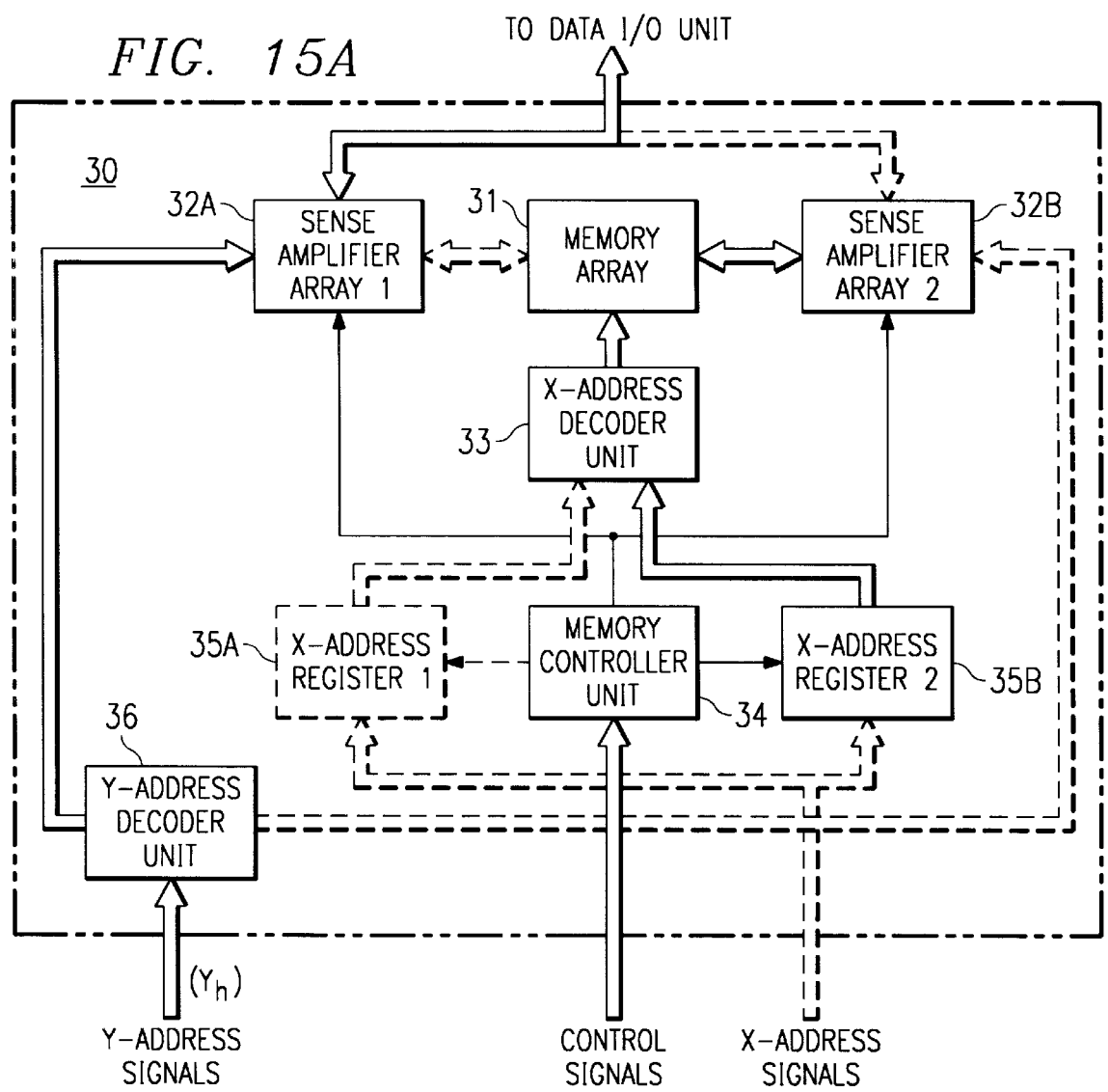
Figure 15B:
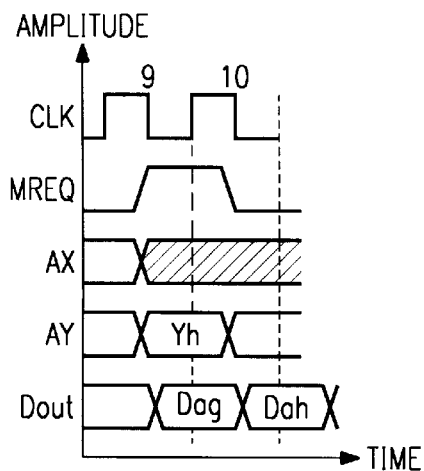
FIG. 15B is a timing diagram showing the time dependence of selected signals during the tenth cycle of a READ operation.
Figure 16A:
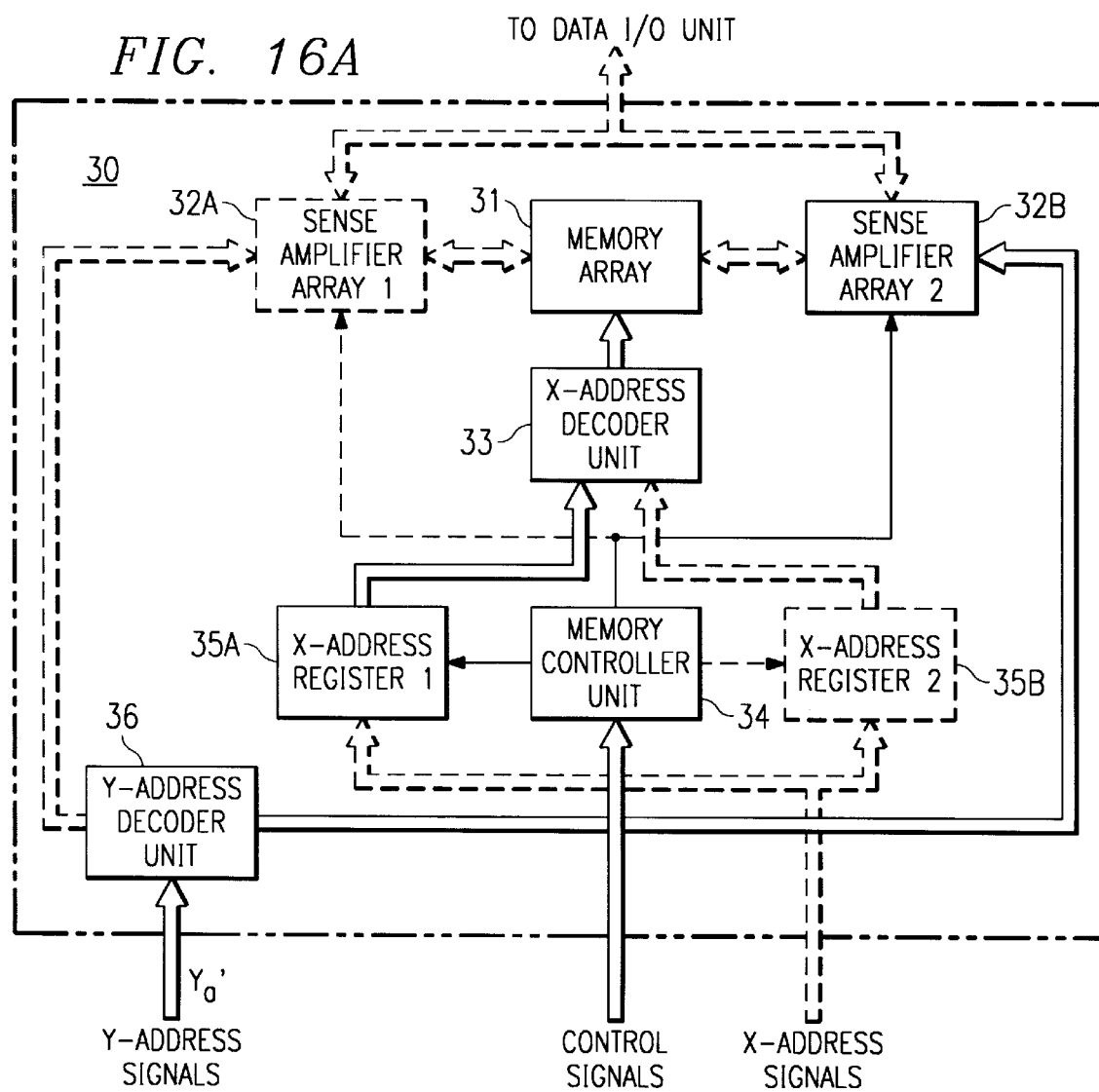
Figure 16B:
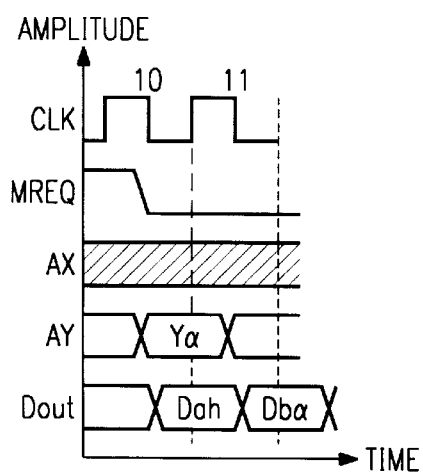
FIG. 16B is a timing diagram showing the time dependence of selected signals during the eleventh cycle of a READ operation.
Figure 17A:
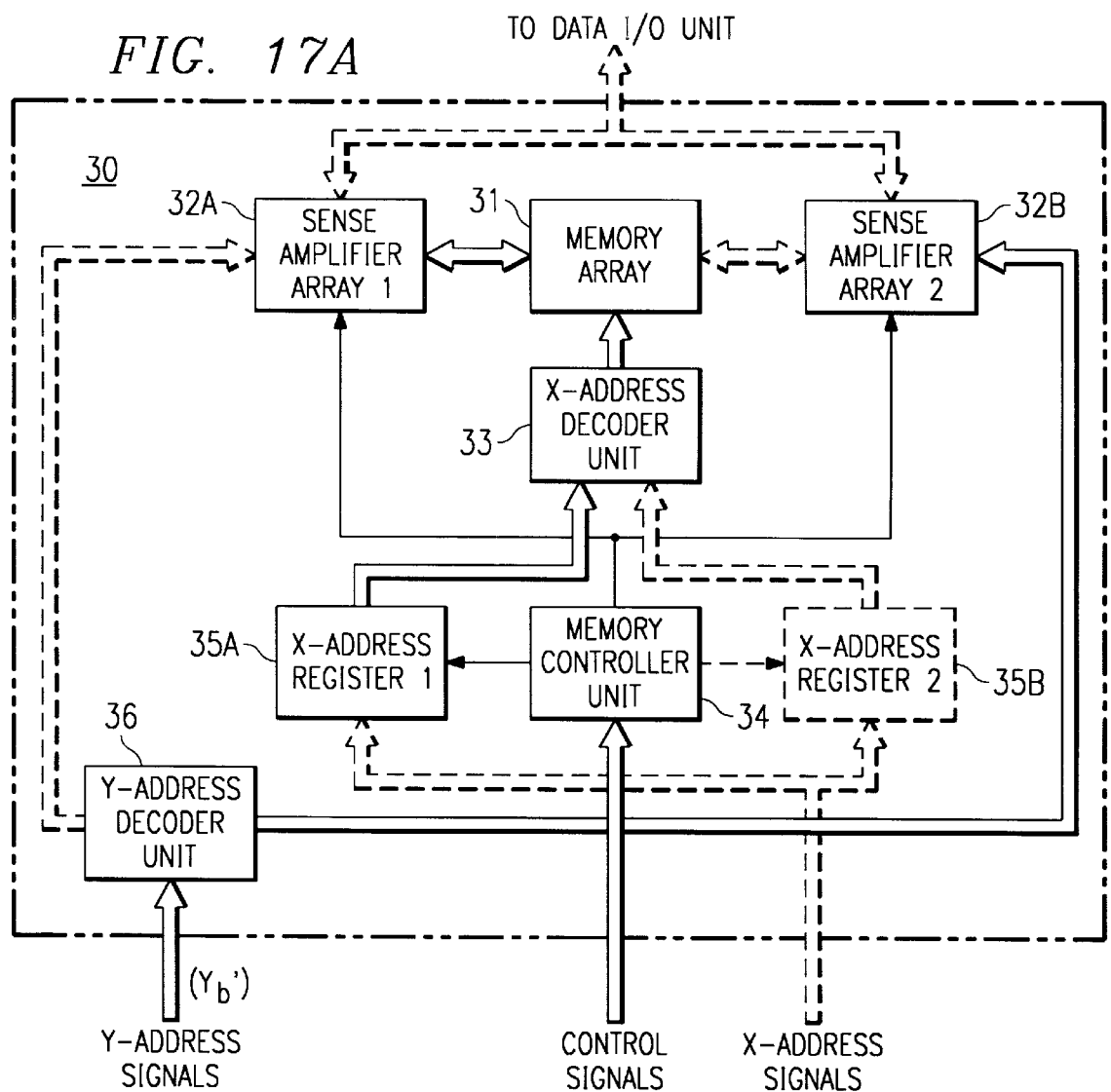
Figure 17B:
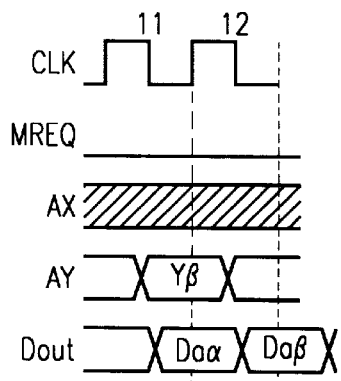
FIG. 17B is a timing diagram showing the time dependence of selected signals during the twelfth cycle of a READ operation.

Referring to FIG. 14A, FIG. 14B and FIG. 6, in the ninth cycle, the new x-address Xb is being applied to the memory unit. The address Xb is latched in x-address register 35B and is applied to the x-address decoder unit 33. After a time delay, the x-address decoder unit 33 activates one of the wordlines Wb in the memory array 31. Data signals in the storage cell coupled to wordline Wb are applied to the bitline and bitline_ conductor pair. And the READ operation continues.

The data in the sense amplifier array 32A will be written into the memory array 31. Therefore, if data WRITE operation(s) has (have) been requested between the third and the tenth cycle, the WRITE operation will occur in the twelfth cycle.

The present invention provides that each storage element of a memory array 31 has two sense amplifiers coupled thereto. The sense amplifiers are organized into arrays 32A and 32B. The data signals from the storage cells are transferred to the bitline conductors and amplified by the associated sense amplifier in the first sense amplifier array. The sense amplifiers of the first sense amplifier array amplifying the data signals on the associated bitline conductor pair are isolated from the bitline conductor pair by the (transistor gates). The first sense amplifier can then transfer (amplified) data signals to the I/O terminals. In the meantime, the second sense amplifier array can be coupled to the bitline conductors through the (transistor) gates. At this point, the data signals from the previous READ, WRITE, or mixed READ and WRITE operation can be restored in the appropriate storage cells. Then the second sense amplifier array can be isolated for the bitline and the Equalization signal (Peq) can be applied to the bitline conductor pairs of the memory array, thereby providing the precharge operations. Thus while one array of sense amplifiers is interacting with the I/O terminals of the memory unit, the second sense amplifier array can be writing back data from the previous operation into the storage elements and the precharge operation performed. The use of the two sense amplifier arrays in this manner permits the operation of the memory unit as a synchronous memory unit, performing the precharge operation without impacting the flow of data signals between the memory unit and an associated data processing operation.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. An integrated circuit memory unit comprising:
    a memory array having a plurality of data storage cells;
    a first sense amplifier array coupled to each of said storage cells for exchanging data signals therewith in response to a first control signal;
    a second sense amplifier array coupled to each of said storage cells for exchanging signals therewith in response to said first control signal; and
    a control unit coupled to said first and to said second sense amplifier array, said control unit applying said first control signal to a one of said sense amplifier arrays, said first control signal resulting in an exchange of data signals between said memory array and said one sense amplifier array, said control unit providing a second control signal to an other sense amplifier array after said first control signal has been removed, said second control signal causing said other sense amplifier array to perform a precharge operation.

2. The memory unit of claim 1 wherein said memory unit is a synchronous dynamic random access memory unit.

3. The memory unit of claim 1 wherein said memory array includes bitline conductor pairs having said storage cells coupled thereto, each sense amplifier array including a plurality of sense amplifiers, each sense amplifier of said first sense amplifier array having a bitline conductor pair extending through said memory unit to an associated sense amplifier of said second sense amplifier array; wherein a transistor gate is coupled between each sense amplifier and said storage cells on each bitline.

4. The memory unit of claim 3 wherein said each sense amplifier and said associated sense amplifier are coupled to two bitline conductor pairs, said gate transistors determining to which bitline pair said each sense amplifier and said associated sense amplifier have access.

5. The memory unit of claim 1 wherein each sense amplifier array of said first sense amplifier array has a neighboring sense amplifier from said second array, said each sense amplifier and said neighboring sense amplifier having a bitline conductor pair which is coupled to said memory unit storage cells, said each sense amplifier and said neighboring sense amplifier having first transistor gates coupled between said sense amplifiers and said bitline conductor pairs, wherein said bitline conductor pair of said each sense amplifier and said bitline conducting pair of said neighboring sense amplifier are coupled together, a one of said two bitline conducting pairs being selected by second transistor gates in response to control signals.

6. The memory unit of claim 5 wherein each bitline conductor pair has a signal equalization transistor coupled therebetween.

7. The memory unit of claim 6 wherein each storage cell includes:

a capacitor plate and a portion of a transistor formed from a n+-doped layer;
    a control conducting path formed from a polysilicon layer acting a the gate terminal of said transistor;
    a first set of conducting paths formed from a first metal layer;
    a coupling conducting path formed from a second metal layer; and
    a second set of conducting paths formed from a third metal layer, wherein said coupling conducting path couples a one of said first and said second set of conducting paths to said control conducting path.

8. The memory unit of claim 1 further comprising a first and a second x-address register responsive to signals from said control unit, one x-address register having the x-address for the current memory access operation and the other x-address register storing the x-address of a next previous memory access operation.

9. A method for providing a precharge operation for in an integrated circuit memory unit which does not interfere with access to storage cells of a memory array by a central processing unit, a method comprising the steps of:
    providing said integrated circuit memory unit with a first and a second sense amplifier array, each storage cell being coupled to both said first and said second sense amplifier arrays;
    accessing said storage cell array through a one of said sense amplifier arrays;
    electrically isolating said one sense amplifier array from said storage cells; and
    with an other sense amplifier array, implementing said precharge operation.

10. The method of claim 9 further comprising the steps of:
    storing a current x-address in a first register;
    storing a most recent previous address in a second register; and
    storing a next x-address in said second register, said next x-address becoming an up-dated new current address, said current address becoming an up-dated most recent previous address.

11. The method of claim 10 wherein said most recent previous address is used to write-back data signals from the storage signals read during a current memory unit access operation.

12. The method of claim 9 wherein said memory unit operates as a synchronous dynamic random access memory unit.

13. An integrated circuit memory unit comprising:
    an array of storage cells, each storage cell being coupled to a wordline;
    a first sense amplifier array including a plurality of sense amplifiers, each sense amplifier having a bitline conductor pair extending therefrom, each storage cell being coupled to a bitline conductor;
    a second sense amplifier array including a plurality of sense amplifiers, each sense amplifier of said second sense amplifier array coupled to a bitline conductor pair, whereby each bitline conductor pair is coupled to first sense amplifier of said first sense amplifier array and is coupled to a second sense amplifier from said second amplifier array;
    a control unit for providing control signals; and
    a multiplicity of gate elements, a first set of said gate elements coupled between said first sense amplifiers and said bitline conductors for electrically coupling said first sense amplifiers to said bitline conductor pairs in response to a first control signal, a second set of said gate elements coupled between said second sense amplifiers and said bitline conductors for electrically coupling said second sense amplifiers to said bitline conductor pairs in response to a second control signal, a third set of gate elements coupled between each conductor of a bitline conductor pair for electrically coupling said bitline conductor pair in response to a third control signal.

14. The memory unit of claim 13 further comprising a first and a second x-address register, said first and said second registers storing an x-address of a current memory access operation and a most recent previous memory access operation x-address.

15. The memory unit of claim 14 wherein a write-back operation of a most recent previous READ operation is performed, during a current memory unit access cycle, into storage cell locations determined by said stored most recent previous x-address.

16. The memory unit of claim 15 wherein said third control signal activates a precharge operation.

17. The memory unit of claim 13 when said memory unit is a synchronous dynamic random access memory unit.

18. The memory unit of claim 13 wherein each storage cell includes:
a capacitor plate and a portion of a transistor formed from a n+-doped layer;
a control conducting path formed from a polysilicon layer acting a the gate terminal of said transistor;
a first set of conducting paths formed from a first metal layer;
a coupling conducting path formed from a second metal layer; and
a second set of conducting paths formed from a third metal layer, wherein said coupling conducting path couples a one of said first and said second set of conducting paths to said control conducting path.

19. The memory unit of claim 18 wherein said first and said second set of conducting paths are memory unit wordlines.

20. A memory unit comprising:
a memory array including;
a first multiplicity of storage cells;
a second multiplicity of bitline conductor pairs;
a third multiplicity of wordlines, wherein each storage cell is coupled to a wordline and to a bitline conductor of a selected bitline conductor pair;
a first sense amplifier array having each sense amplifier coupled to a bitline pair;
a first coupling means for electrically coupling said biathlons to said sense amplifier array in response to a first control signal;
a second sense amplifier array having each sense amplifier coupled to a bitline pair;
a second coupling means for electrically coupling said biathlons to said sense amplifier array;
third coupling means for electrically coupling conductors of each bitline conductor pair; and
a memory control unit for providing said first, second and third control signals, said memory control unit providing said third control signal when said first and said second sense amplifier arrays are not electrically coupled to said bitline conductor pairs.

21. The memory unit of claim 20 further comprising a first and a second register, wherein contents of said second register are used to select storage cells into which data signals in said second sense amplifier array are to be written when said first sense amplifier array is no longer electrically coupled to bitline conductor pair.

22. The memory unit of claim 21 wherein said memory unit is a synchronous dynamic random access memory unit.

* * * * *